United States Patent (12) United States Patent
Mills (10) Patent No.: US 10,368,462 B2
(45) Date of Patent: Jul. 30, 2019

(54) SECURE TABLET MOUNT (71) Applicant: Colebrook Bosson & Saunders (Products) Limited, London (GB)

(72) Inventor: Jonathan Mills, Sheffield (GB)

(73) Assignee: COLEBROOK BOSSON & SAUNDERS (PRODUCTS) LIMITED, London (GB)

(*) Notice: Subject to any disclaimer, the term of this patent is extended or adjusted under 35 U.S.C. 154(b) by 0 days.

(21) Appl. No.: 15/969,481

(22) Filed: May 2, 2018

(65) Prior Publication Data
US 2018/0324974 A1  Nov. 8, 2018

Related U.S. Application Data (60) Provisional application No. 62/502,192, filed on May 5, 2017.

(51) Int. Cl.
| A47B 97/04 | (2006.01) |
| H05K 7/18 | (2006.01) |
| A47B 23/00 | (2006.01) |
| F16M 11/04 | (2006.01) |
| F16M 13/02 | (2006.01) |
| G06F 1/16 | (2006.01) |
| E05B 73/00 | (2006.01) |

(52) U.S. Cl.
CPC ............ *H05K 7/18* (2013.01); *A47B 23/00* (2013.01); *F16M 11/041* (2013.01); *F16M 13/02* (2013.01); *E05B 2073/0088* (2013.01); *G06F 1/1626* (2013.01)

(58) Field of Classification Search
CPC ......... H05K 7/18; A47B 23/00; G06F 1/1626; F16M 11/041

USPC .................. 248/451; 361/679.55, 679.56
See application file for complete search history.

(56) References Cited

U.S. PATENT DOCUMENTS

| 4,949,483 | A | 8/1990 | Dobson et al. |
| 6,802,575 | B1 | 10/2004 | Lee |
| D671,545 | S | 11/2012 | Guran |
| 8,542,495 | B1 | 9/2013 | Gorman et al. |
| 8,991,775 | B2 | 3/2015 | White et al. |
| D733,157 | S | 6/2015 | Kim et al. |

(Continued)

FOREIGN PATENT DOCUMENTS

| CN | 203176681 U | 9/2013 |
| GB | 2524783 A | 10/2015 |
| WO | 2015150729 A2 | 10/2015 |

OTHER PUBLICATIONS

International Search Report and Written Opinion, received International Patent Application No. PCT/GB2018/051194, dated Jul. 26, 2018 (13 pages).

*Primary Examiner* — Todd M Epps
(74) *Attorney, Agent, or Firm* — Michael Best & Friedrich LLP (57) ABSTRACT

A tablet support includes a backing member and a faceplate connected to the backing member to at least partially define a housing configured to receive a tablet. A bracket is configured to retain the tablet in the housing. The housing includes a first connecting feature and the bracket includes a second connecting feature configured to mate with the first connecting feature. Adjustment of one of the first connecting feature and the second connecting feature determines the relative position of the tablet in the housing.

19 Claims, 10 Drawing Sheets

(56) References Cited

U.S. PATENT DOCUMENTS

| | | | |
|---|---|---|---|
| D735,727 S | 8/2015 | Dugger et al. | |
| 9,146,584 B2 | 9/2015 | Bowles | |
| D746,824 S | 1/2016 | Heckler | |
| 9,326,623 B2 | 5/2016 | Harwell et al. | |
| 9,395,037 B2 | 7/2016 | Ballhatchet | |
| 9,441,782 B2 | 9/2016 | Funk et al. | |
| 9,577,694 B1 * | 2/2017 | Albee | H04B 1/3877 |
| 9,606,580 B2 | 3/2017 | Garland, Sr. et al. | |
| 9,634,519 B2 | 4/2017 | King et al. | |
| 2009/0072678 A1 | 3/2009 | Yokawa | |
| 2012/0061542 A1 * | 3/2012 | Bostater | G06F 1/1628 |
| | | | 248/278.1 |
| 2013/0048802 A1 * | 2/2013 | Guran | F16M 11/041 |
| | | | 248/122.1 |
| 2013/0056374 A1 | 3/2013 | Chung | |
| 2013/0180141 A1 | 7/2013 | Huang | |
| 2013/0342087 A1 | 12/2013 | Guran | |
| 2014/0263884 A1 * | 9/2014 | Grziwok | F16M 11/06 |
| | | | 248/176.3 |
| 2017/0009935 A1 * | 1/2017 | Theis | F16M 11/041 |
| 2018/0080597 A1 * | 3/2018 | Weldon | F16M 11/14 |

* cited by examiner

SECURE TABLET MOUNT

RELATED APPLICATION(S)

This application is based on U.S. Provisional Application Ser. No. 62/502,192, filed May 5, 2017, the disclosure of which is incorporated herein by reference in its entirety and to which priority is claimed.

FIELD

Various exemplary embodiments relate to secure tablet mounts for public spaces.

SUMMARY

According to an exemplary embodiment, a tablet support includes a backing member and a faceplate connected to the backing member to at least partially define a housing configured to receive a tablet. A bracket is configured to retain the tablet in the housing. The housing includes a first connecting feature and the bracket includes a second connecting feature configured to mate with the first connecting feature. Adjustment of one of the first connecting feature and the second connecting feature determines the relative position of the tablet in the housing.

According to another exemplary embodiment, a tablet support includes a backing member and a faceplate having a tapered first projection extending from an inner surface of the faceplate toward the backing member. The faceplate connects to the backing member to at least partially defining a housing configured to receive a tablet. A first bracket is configured to connect a tablet to the faceplate. The first bracket has a first slot positioned to receive the first projection. The width of the first slot determines a relative position between the bracket and the faceplate.

Another exemplary embodiment includes a method of manufacturing a tablet support. A housing is provided that is configured to receive a tablet. The housing includes a first connecting feature. A bracket is provided that is configured to retain the tablet in the housing. The bracket includes a second connecting feature configured to mate with the first connecting feature. The size of one of the first connecting feature and the second connecting feature is adjusted based on the thickness of the tablet to position the tablet in the housing.

BRIEF DESCRIPTION OF THE DRAWINGS

The aspects and features of various exemplary embodiments will be more apparent from the description of those exemplary embodiments taken with reference to the accompanying drawings, in which.

DETAILED DESCRIPTION OF EXEMPLARY EMBODIMENTS

Various exemplary embodiments are directed to a secured tablet mount that can be used in public spaces. The mount is configured to help prevent theft of a tablet secured in the mount, while making it accessible to users.

Figure 1:
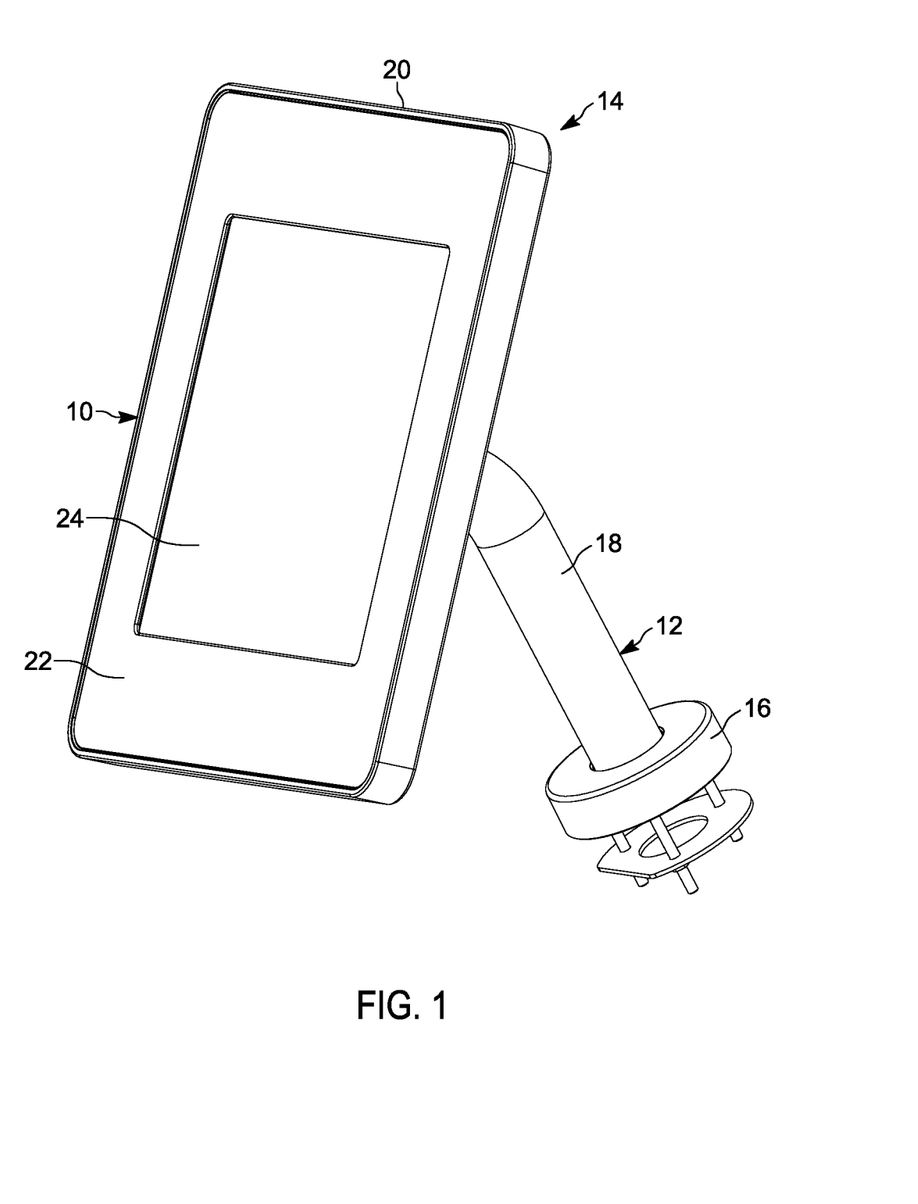
FIG. 1 is a front perspective of a secure tablet mount.

FIG. 1 shows an exemplary embodiment of a secure tablet mount 10 having a support 12 connected to a tablet housing 14. The housing 14 can be fixed or rotatably connected to the support 12. For example, a rotation mechanism can be connected to the support 12 and the housing 14 to allow the housing to rotate between landscape and portrait orientations, and to allow the housing 14 to for vertical movement to adjust the viewing angle.

The support 12 includes a base assembly 16 that connects the tablet mount to a surface or structure, such as a table or other horizontal surface. A stem 18 extends from the base assembly 16 to the tablet housing 14. Different supports can be used to connect the tablet mount to a wall, floor, post, kiosk, or other structure.

Figure 2:
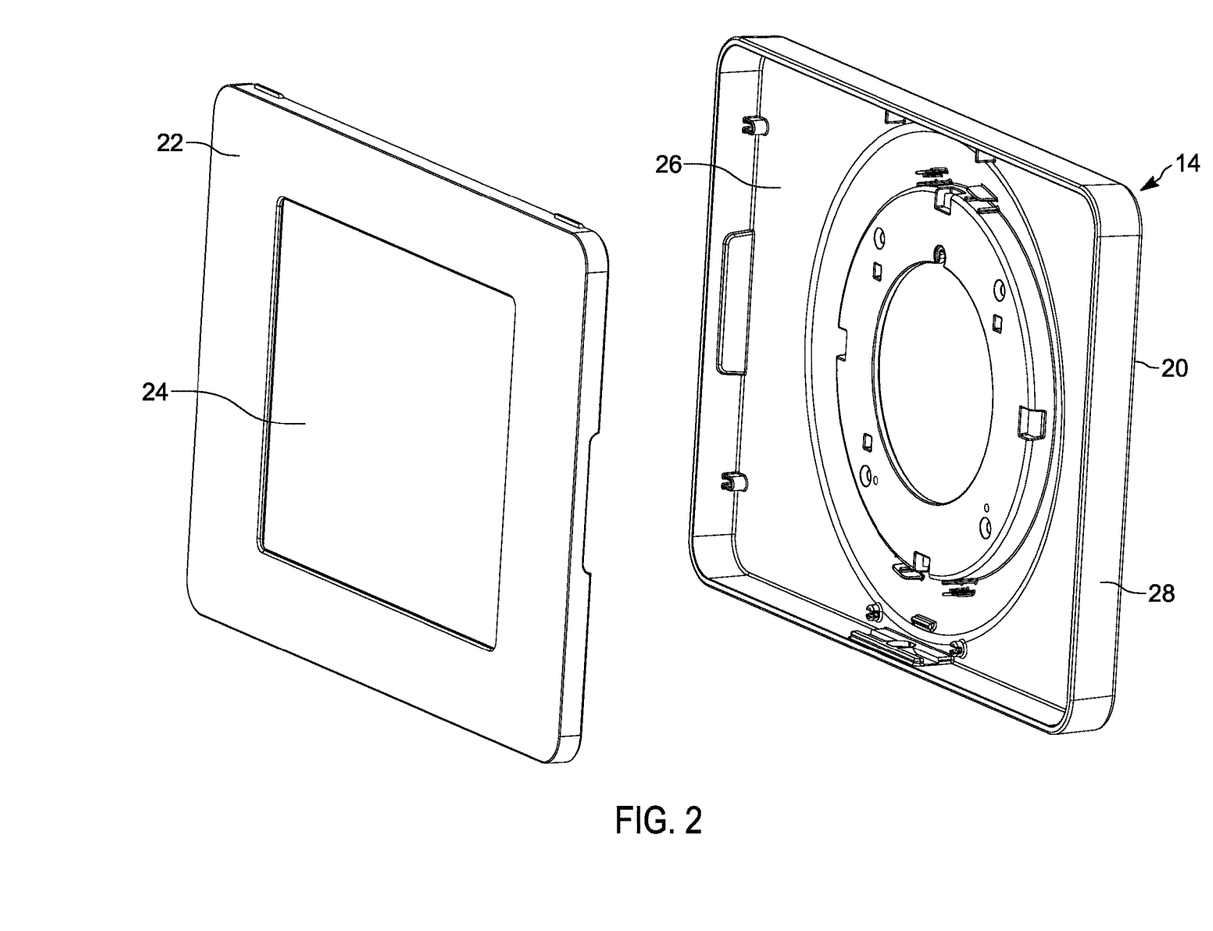
FIG. 2 is a partially exploded, front perspective of the tablet housing.

As shown in FIG. 2, the tablet housing 14 includes a backing member 20 that receives a faceplate 22 and the tablet 24. The faceplate 22 includes a central opening that allows a user to access the tablet 24. A screen or protective covering can be provided over the central opening. The backing member 20 includes a rear wall 26 having a central opening to receive the support 12 and/or the rotation mechanism. A flange 28 extends from the rear wall 26 to define an interior. The faceplate 22 and tablet 24 fit inside of the interior of the backing member 20 so that faceplate 22 is substantially flush with an outer edge of the flange 28. One or more mounting components are used to connect the tablet 24 to the face plate 22 and to properly position the tablet 24 relative to the opening in the faceplate 22.

Figure 3:
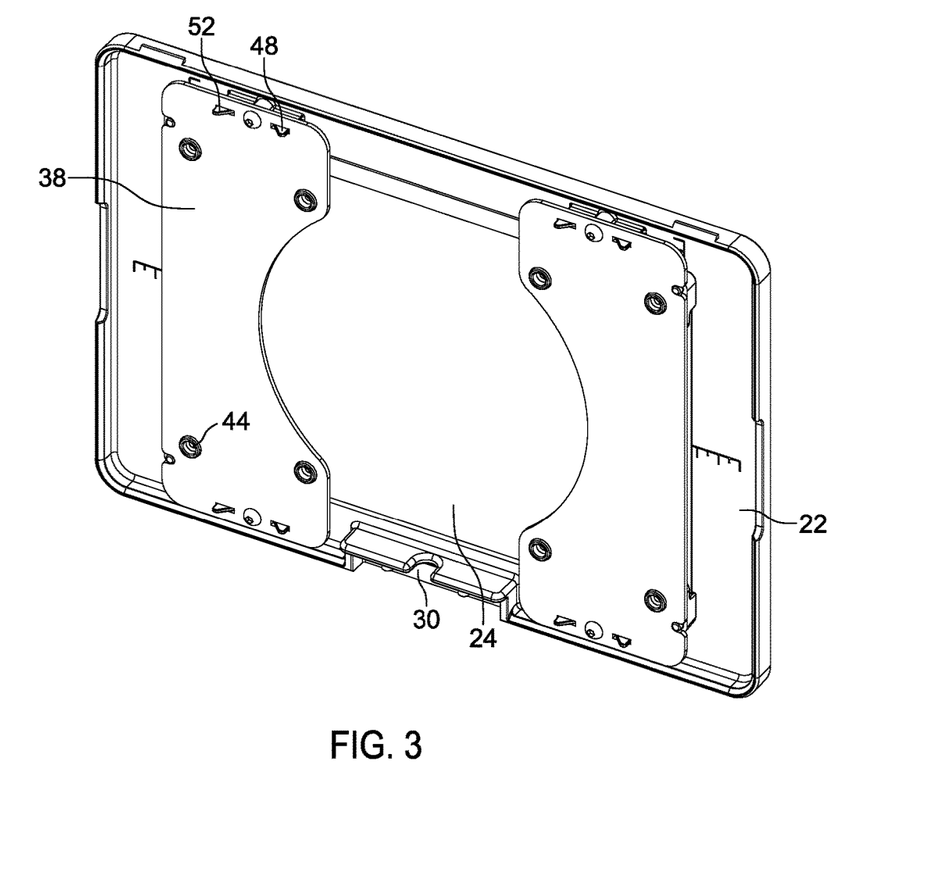
FIG. 3 is a rear perspective view of the tablet, faceplate, and mounting components.
Figure 4:
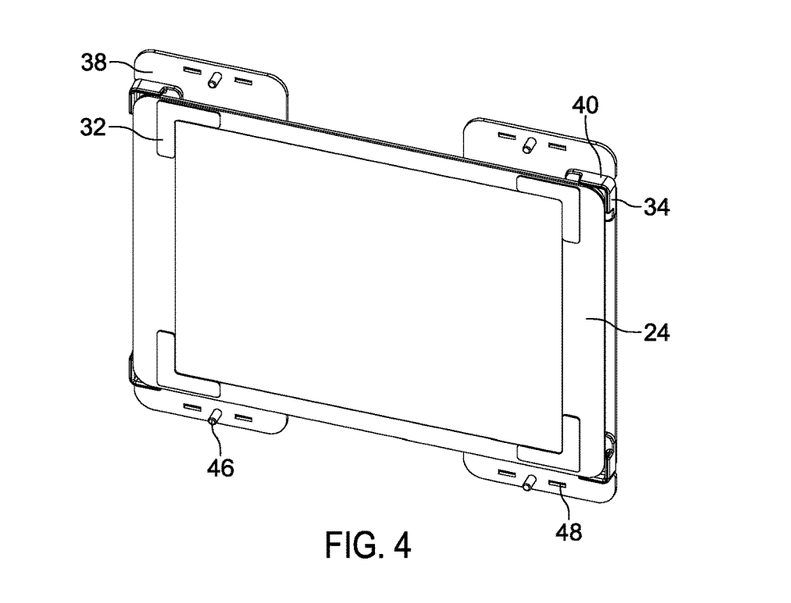
FIG. 4 is a front perspective view of the tablet and mounting components.

As shown in FIG. 3, the faceplate 22 includes a fastener receiving aperture 30 that is configured to receive a fastener that secures the faceplate 22 to the backing member 20. The fastener can be an anti-theft bolt, for example having an uncommon or specialized head. The fastener can also take the form of a lock or other secure latching mechanism. FIG. 4 shows a set of cushions 32 that can be applied to the exterior of the tablet 24. The cushions 32 can also be applied to an interior surface of the faceplate 22.

FIGS. 3-6 show an exemplary embodiment of a mounting assembly for the tablet 24. The mounting assembly includes a first set of spacers 34 and a second set of spacers 36 connected brackets 38. The brackets 38 have a substantially rectangular footprint with a semi-circular edge formed in one of the sides. Other sizes and shapes of beckets 38 can be used, and although the brackets 38 are shown as substantially identical, non-identical configurations can also be used.

Figure 5:
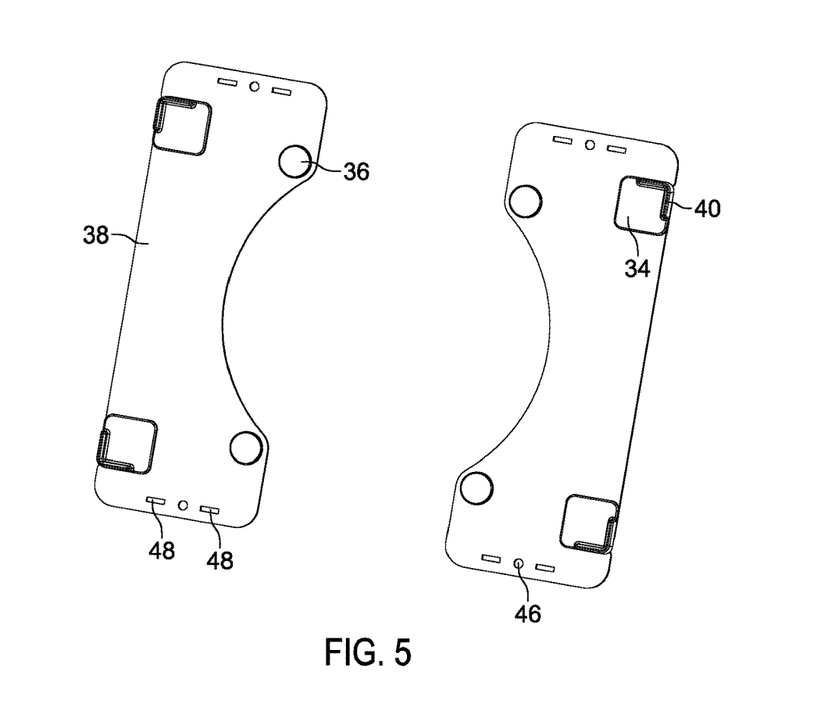
FIG. 5 is a front perspective view of the brackets and spacers.

The spacers 34, 36 are used to support and position the tablet 24. As best shown in FIG. 5, the first spacers 34 can include a pair of corner spacers having L-shaped corner tabs 40 that receive opposite corners of the tablet to horizontally and vertically position and support the tablet 24. The first spacers 34 are positioned proximate the outer edge of the bracket 38. The second spacers 36 are positioned proximate an inner edge of the bracket. The second spacers 36 can be used to provide support and/or cushioning for the tablet 24. The position of the first and second spacers 34, 36 can be varied as necessary based on the layout or configuration of the tablet 24. For example, the first and second spacers 34, 36 can be positioned to avoid a power/data input (e.g. USB type connection) or control button (e.g. power, volume) located along an outer edge of the tablet.

Figure 6:
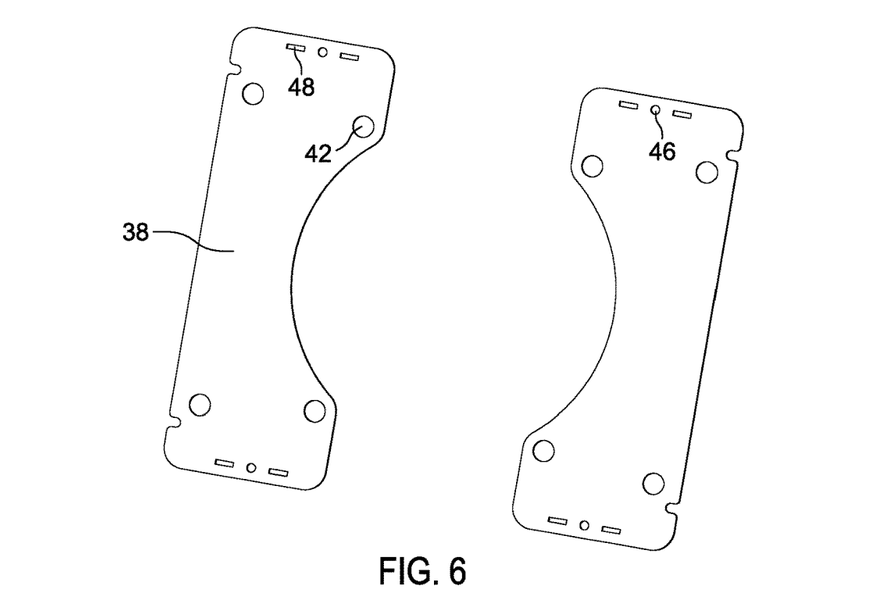
FIG. 6 is a front perspective view of the brackets.

As best shown in FIGS. 3 and 6, the brackets 38 have a set of spacer openings 42 for receiving the first and second spacers 34, 36. The spacers 34, 36 can include projections 44 extending from a rear surface as shown in FIG. 3 and corresponding to the spacer openings 42. The projections 44 can include a first portion that is larger than the spacer openings 42 and a second portion that is smaller or substantially similar in size to the spacer openings 42. The projections 44 can be resiliently deformable so that the first portion is deformed as it is pushed through the spacer opening 42 and then returns to its original size to secure the spacer 34, 36 to the bracket 38. The first spacers 34 can also include a second projection that mates with an opening or slot in the bracket to help prevent rotation of the spacer 34.

Figure 7:
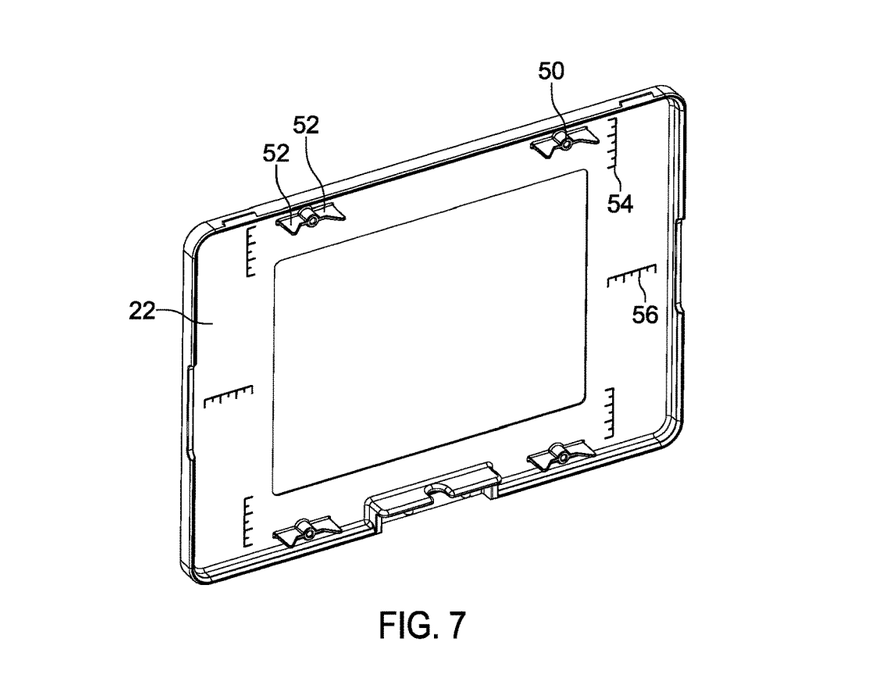
FIG. 7 is a rear perspective view of the faceplate.
Figure 8:
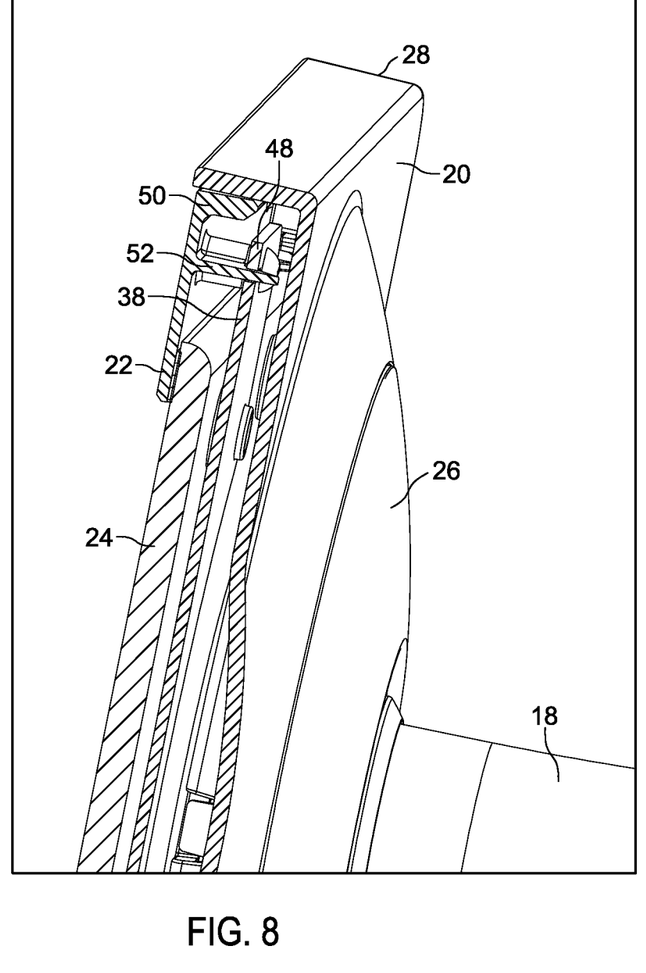
FIG. 8 is a side, sectional view of FIG. 1.

The brackets 38 also include multiple sets of alignment openings that are used to adjust the position of the tablet 24. In an exemplary embodiment, the alignment openings include a central aperture 46 positioned between first and second slots 48. As best shown in FIG. 7, the faceplate 22 includes connecting features corresponding to the alignment openings on the brackets 38. In an exemplary embodiment, the connecting features include a central boss 50 that aligns with the central aperture 46 and first and second projections 52 that align with the first and second slots 48. The projections 52 extend from an inner surface of the faceplate 22. The apertures 46 and bosses 50 receive fasteners, for example a threaded screw, and the slots 48 receive the projections 52. In an exemplary embodiment, the projections 52 have a varying width that tapers from a base to an outer edge. In the illustrated embodiment the projections 52 have a substantially triangular configuration that tapers to a point. As shown in FIG. 8, the projections 52 extend into the slots 48 until the width of the projection 52 forms an interference fit with the slot 48. While the projections 52 are shown in the faceplate 22, the parts may be rearranged so that the projections 52 can be provided on the backing member 20.

As shown in FIG. 7, one or more pairs of hatch marks can be provided on an inner surface of the faceplate 22 to help a user center the tablet 24 during installation. For example, one or more pairs of vertical hatch marks 54 and one or more pairs of horizontal hatch marks 56 can be used to center the vertical and horizontal position of the tablet 24, as well as to level the tablet 24 so the outer edges of the tablet 24 are aligned with the edges of the housing. Properly positioning an securing the tablet 24 to the faceplate 22 can help ensure accurate alignment throughout the working life of the product, as opposed to sandwiching the tablet 24 in the backing member 20 which can result in drift of the tablet 24 out of alignment with the front opening in the faceplate 22.

While tablets from different manufacturers and different versions from the same manufacturer, can have different screen sizes and variable thickness, height, and width. Being able to properly positioning different tablets inside of a secure housing can be difficult and result in the need for multiple designs, complex interior components, or an increased number of parts that need to be manufactured and stored in inventory or provided to a user for assembly. Because the sizes of tablets change, in some cases yearly, new parts or entire housings may need to be designed and manufactured to keep pace.

The present mounting components overcome these disadvantages by providing a set of components that can be altered as needed to accommodate different heights, widths, and thicknesses of tablets. In an exemplary embodiment the brackets 38 and the spacers 34, 36 are made to a single size. For example the brackets 38 can be made out of stamped sheet metal and the spacers can be include a molded polymer (other materials and manufacturing processes may be used). A subsequent operation can then form the inner openings 42 and the outer openings 46, 48 in the brackets 38. The subsequent operation can be a material removal process, for example laser cutting. Molding of the faceplate 22 and the spacers 34, 36 can require the creation of dedicated molds that are costly and are only capable of producing a single part design.

In other embodiments, the brackets 38, the inner openings 42, and the outer openings 46, 48 can be formed in a single operation. The operation can includes a material removal process, such as laser cutting. The entire bracket 38 is formed in one operation based on the tablet dimensions as discussed above. The single operation forming of the brackets 38 still allows for the reduced cost and flexibility discussed above, with the faceplate 22 and spacers 34, 36 are formed to a standard size. Forming the brackets 38 based on individual tablet dimensions results in greater flexibility and allows for on-demand manufacturing.

The inner openings 42 are formed at a position in the bracket 38 that accommodates the length and height of the tablet 24. This allows the spacers 34, 36 to properly position the tablet 24 relative to the faceplate 22 opening and prevent horizontal or vertical movement. The outer openings 46, 48 can be formed to control the width of the slots 48 to correspond to the thickness of the tablet 24. As best shown in FIG. 8, the position of the brackets 38 relative to the face plate 22 depends on the distance the projections 52 travel through the slots 48 until the width of the projections 52 engage the sides of the slots 48. In this way, wider slots 48 can be made to accommodate a thinner tablet 24 and narrower slots 48 can be made to accommodate a thicker tablet 24. This allows the tablet screen to be properly positioned relative to the opening in the faceplate 22 while the tablet 24 is properly supported using the same thickness spacers 34, 36, brackets 38 or other components.

In certain embodiments, the faceplate 22 can also be formed through a molding procedure to have either no central opening, or a central opening with an initial size. A subsequent procedure can be used to create or adjust the size of the central opening to accommodate the screen size of the tablet 24 and also to accommodate any buttons positioned on the front of the tablet screen. The opening can either be sized to prevent or to allow access to such front facing buttons. The subsequent procedure is a material removal process, for example CNC milling.

Figure 11:
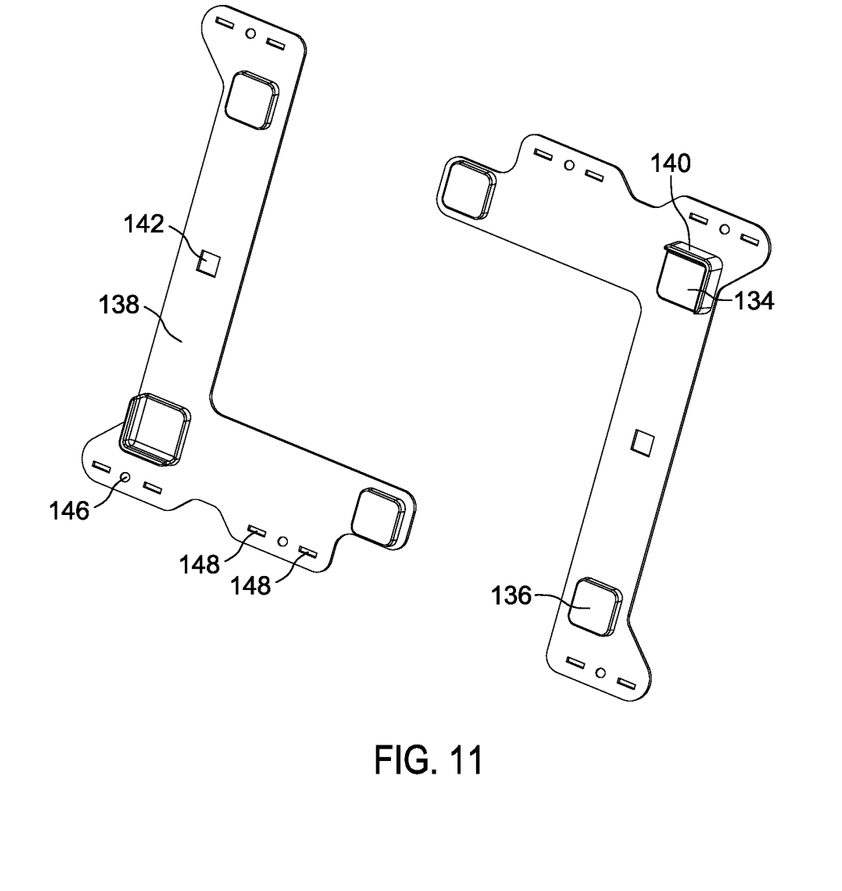
FIG. 11 is a front perspective view of the brackets and spacers of FIG. 9.

FIGS. 9-12 show another exemplary embodiment of a mounting assembly for the tablet 24. The mounting assembly includes a first set of spacers 134 and a second set of spacers 136 connected L-shaped brackets 138. The brackets 138 are shown as substantially identical, although other configurations can be used. As best shown in FIG. 11, the first spacers 134 can include a pair of corner spacers having L-shaped corner tabs 140 that receive opposite corners of the tablet to horizontally and vertically position and support the tablet 124. The first spacers 134 are positioned proximate the intersection of the legs of the brackets 138 legs. The second spacers 136 are positioned proximate the first end and the second end of the brackets 138. The second spacers 136 can be used to provide support and/or cushioning for the tablet 24. The position of the first and second spacers 134, 136 can be varied as necessary based on the layout or configuration of the tablet 24. For example, the first and second spacers 134, 136 can be positioned to avoid a power/data input (e.g. USB type connection) or control button (e.g. power, volume) located along an outer edge of the tablet. This may require switching the position of the first spacers 134 to the opposite corners from what is shown.

Figure 9:
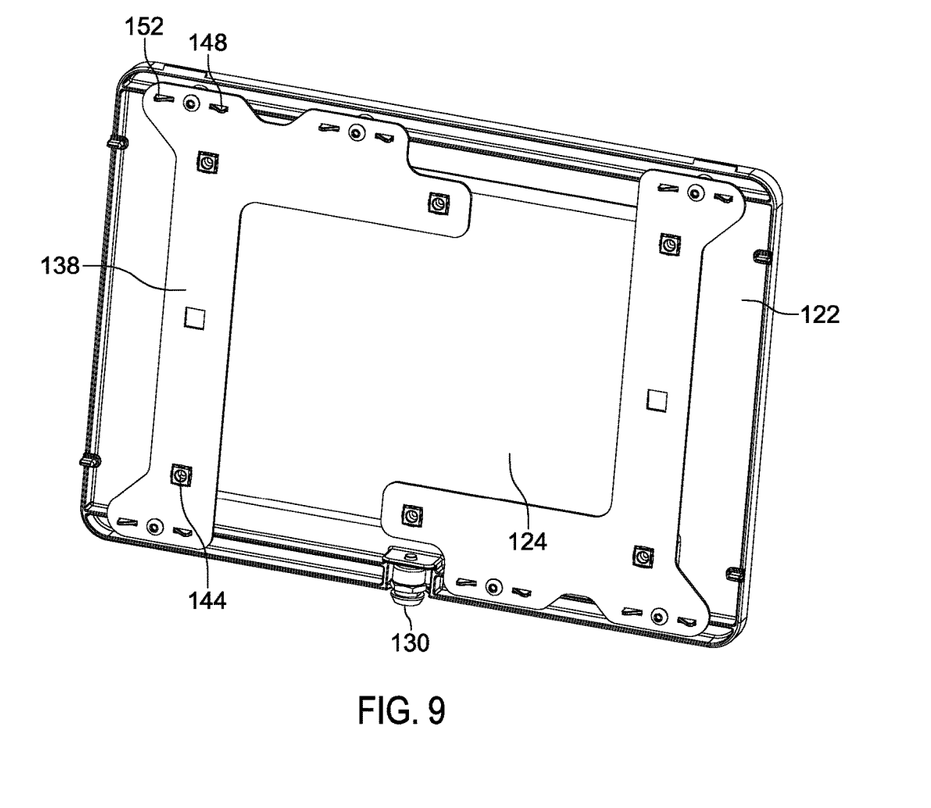
FIG. 9 is a rear perspective view of the tablet, faceplate, and another exemplary embodiment of the mounting components.
Figure 10:
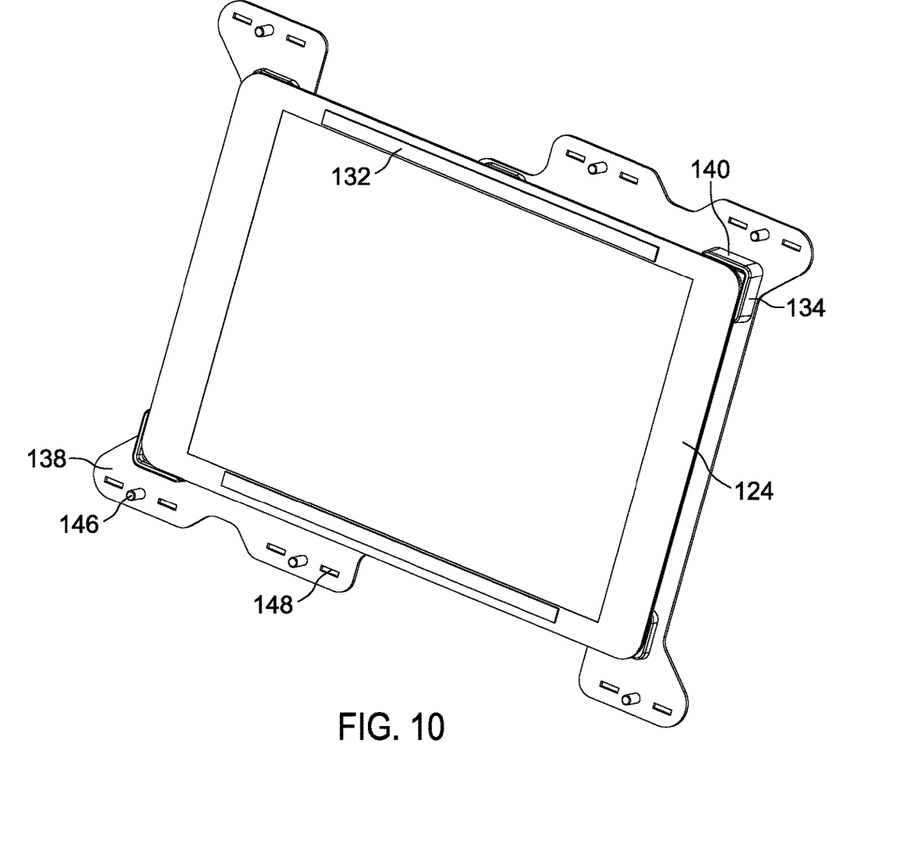
FIG. 10 is a front perspective view of the tablet and mounting components of FIG. 9.
Figure 12:
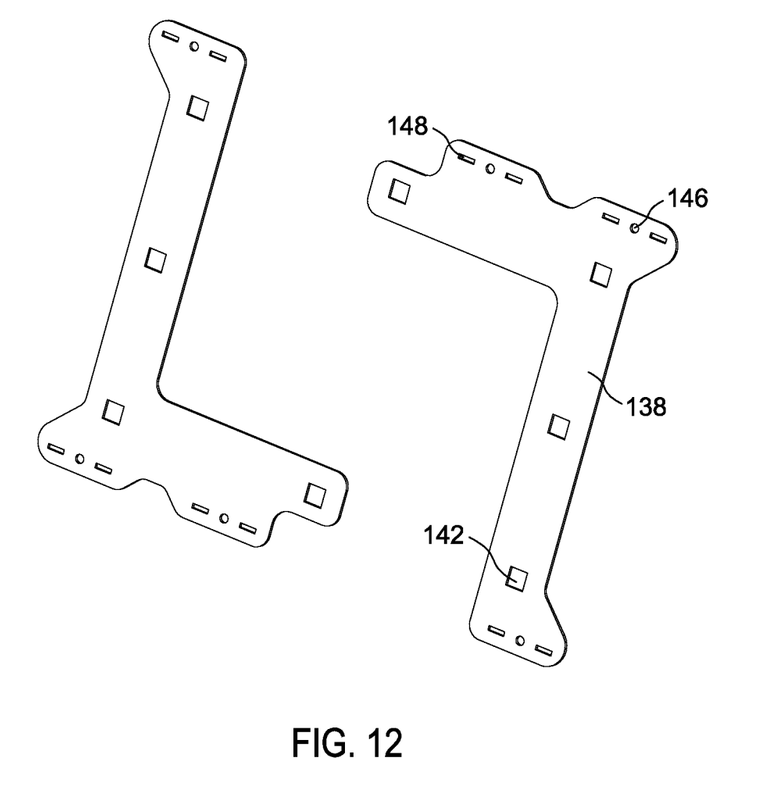
FIG. 12 is a front perspective view of the brackets of FIG. 9.

As best shown in FIGS. 11 and 12, the brackets 138 have a set of inner openings 142 for receiving the first and second spacers 134, 136. The inner openings 142 have a substantially square configuration and the spacers can include corresponding square projections 144 extending from a rear surface as shown in FIG. 9. The square projections 144 can include a first portion that is larger than the square openings 142 and a second portion that is smaller or substantially similar size to the square openings 142. The projections 144 can be resiliently deformable so that the first portion is deformed as it is pushed through the square opening 142 and then returns to its original size to secure the spacer 134, 136 to the bracket 138.

The brackets 138 also include multiple sets of outer openings, which include a central aperture 146 positioned between first and second slots 148. As best shown in FIG. 7, the faceplate 22 includes connecting features corresponding to the outer openings on the brackets 138. The connecting features include a central boss 50 that aligns with the central aperture 146 and first and second projections 52 that align with the first and second slots 148. The apertures 146 and bosses 50 receive fasteners, for example a threaded screw, and the slots 148 receive the projections 52. In an exemplary embodiment, the projections 52 have a varying width that tapers from a base to an outer edge. In the illustrated embodiment the projections 12 have a substantially triangular configuration that tapers to a point. The projections 52 extend into the slots 148 until the width of the projection 52 forms an interference fit with the slot 148.

The foregoing detailed description of the certain exemplary embodiments has been provided for the purpose of explaining the general principles and practical application, thereby enabling others skilled in the art to understand the disclosure for various embodiments and with various modifications as are suited to the particular use contemplated. This description is not necessarily intended to be exhaustive or to limit the disclosure to the exemplary embodiments disclosed. Any of the embodiments and/or elements disclosed herein may be combined with one another to form various additional embodiments not specifically disclosed. Accordingly, additional embodiments are possible and are intended to be encompassed within this specification and the scope of the appended claims. The specification describes specific examples to accomplish a more general goal that may be accomplished in another way.

As used in this application, the terms "front," "rear," "upper," "lower," "upwardly," "downwardly," and other orientational descriptors are intended to facilitate the description of the exemplary embodiments of the present disclosure, and are not intended to limit the structure of the exemplary embodiments of the present disclosure to any particular position or orientation. Terms of degree, such as "substantially" or "approximately" are understood by those of ordinary skill to refer to reasonable ranges outside of the given value, for example, general tolerances associated with manufacturing, assembly, and use of the described embodiments.

What is claimed:

1. A tablet support comprising:
   a backing member;
   a faceplate connected to the backing member to at least partially define a housing configured to receive a tablet; and
   a bracket configured to retain the tablet in the housing,
   wherein the housing includes a first connecting feature and the bracket includes a second connecting feature configured to mate with the first connecting feature, and wherein adjustment of one of the first connecting feature and the second connecting feature determines a relative position of the tablet in the housing, and
   the first connecting feature includes a tapered first projection extending toward the bracket and the second connecting feature includes a first slot configured to receive the first projection, and wherein a width of the first slot determines the relative position of the tablet in the housing.

2. The tablet support of claim 1, wherein the first protrusion extends from an inner surface of the faceplate toward the backing member.

3. The tablet support of claim 1, wherein the first protrusion has a triangular cross-section.

4. The tablet support of claim 1, further comprising a spacer connected to the bracket to engage the tablet.

5. The tablet support of claim 4, wherein the spacer includes a corner tab.

6. The tablet support of claim 4, wherein the spacer includes a protrusion and the bracket includes a spacer opening receiving the protrusion.

7. The tablet support of claim 1, wherein the backing member is movably connected to a post.

8. The tablet support of claim 1, wherein the faceplate includes a set of horizontal hatch marks and a set of vertical hatch marks.

9. A tablet support comprising:
   a backing member;
   a faceplate having a tapered first projection extending from an inner surface of the faceplate toward the backing member, the faceplate connects to the backing member to at least partially define a housing configured to receive a tablet; and
   a first bracket configured to connect a tablet to the faceplate, the first bracket having a first slot positioned to receive the first projection, wherein a width of the first slot determines a relative position between the bracket and the faceplate.

10. The tablet support of claim 9, wherein a first spacer is connected to the first bracket and configured to receive a first corner of the tablet and a second spacer is connected to the first bracket and configured to receive a second corner of the tablet.

11. The tablet support of claim 9, wherein the faceplate includes a tapered second projection and a boss positioned between the first and second tapered projections, and the bracket includes a second slot positioned to receive the second projection and an aperture positioned between the first and second slots and positioned to align with the central aperture.

12. The tablet support of claim 9, further comprising a second bracket having a second slot positioned to receive a second projection, wherein the first bracket is spaced from the second bracket.

13. The tablet support of claim 9, wherein the first bracket has a substantially rectangular footprint with a semi-circular edge.

14. The tablet support of claim 9, wherein the first bracket has a substantially L-shaped configuration.

15. A method of manufacturing a tablet support comprising:
provided a housing configured to receive a tablet, wherein the housing includes a tapered first projection; and
providing a bracket configured to retain the tablet in the housing, wherein the bracket includes a first slot configured to mate with the first projection, and
wherein a size of one of the first projection and the first slot is adjusted based on a thickness of the tablet to position the tablet in the housing.

16. The method of claim 15, wherein providing a housing includes providing a backing member and providing a faceplate configured to connect to the backing member.

17. The method of claim 15, wherein a width of the first slot determines the relative position of the tablet in the housing.

18. The method of claim 15, wherein a spacer opening is formed in the bracket and the position of the spacer opening is based on a height and a width of the tablet.

19. The method of claim 15, wherein the bracket has a substantially rectangular footprint with a semi-circular edge.

* * * * *